United States Patent
Lee

(10) Patent No.: US 10,372,157 B2
(45) Date of Patent: Aug. 6, 2019

(54) SEMICONDUCTOR DEVICES

(71) Applicant: SK hynix Inc., Icheon (KR)

(72) Inventor: Dong Uk Lee, Seoul (KR)

(73) Assignee: SK HYNIX INC., Icheon (KR)

( * ) Notice: Subject to any disclaimer, the term of this patent is extended or adjusted under 35 U.S.C. 154(b) by 228 days.

(21) Appl. No.: 15/627,155

(22) Filed: Jun. 19, 2017

(65) Prior Publication Data

US 2018/0173270 A1    Jun. 21, 2018

(30) Foreign Application Priority Data

Dec. 21, 2016 (KR) .................. 10-2016-0175758

(51) Int. Cl.
| | | |
|---|---|---|
| *G06F 1/10* | (2006.01) | |
| *G06F 1/12* | (2006.01) | |
| *G06F 1/08* | (2006.01) | |
| *G11C 11/4096* | (2006.01) | |
| *G11C 7/10* | (2006.01) | |
| *G11C 7/22* | (2006.01) | |
| *G11C 11/4076* | (2006.01) | |

(52) U.S. Cl.
CPC .................. *G06F 1/10* (2013.01); *G06F 1/08* (2013.01); *G06F 1/12* (2013.01); *G11C 7/106* (2013.01); *G11C 7/1039* (2013.01); *G11C 7/1066* (2013.01); *G11C 7/1087* (2013.01); *G11C 7/1093* (2013.01); *G11C 7/222* (2013.01); *G11C 11/4076* (2013.01); *G11C 11/4096* (2013.01); *G11C 2207/2272* (2013.01)

(58) Field of Classification Search
CPC ..... G06F 1/12; G06F 1/14; G06F 1/10; G06F 5/06; G06F 13/1689; G06F 1/08; G06F 1/04; G06F 1/3202; G06F 9/4825; G06F 11/0757; G06F 11/3419; G11C 7/22
See application file for complete search history.

(56) References Cited

U.S. PATENT DOCUMENTS

| | | | | |
|---|---|---|---|---|
| 9,396,777 | B1 * | 7/2016 | Lee | G11C 5/02 |
| 9,847,113 | B2 * | 12/2017 | Choi | G11C 7/222 |
| 2007/0186034 | A1 | 8/2007 | Mes | |
| 2008/0232179 | A1 * | 9/2008 | Kwak | G11C 7/1051 |
| | | | | 365/194 |

(Continued)

FOREIGN PATENT DOCUMENTS

KR    10-0670698 B1    1/2007

*Primary Examiner* — Zahid Choudhury

(57) ABSTRACT

A semiconductor device includes a phase comparison circuit, an output enablement signal generation circuit, and a data input/output (I/O) circuit. The phase comparison circuit compares a phase of a clock signal with a phase of a delay locked loop (DLL) clock signal to generate a phase information signal. The output enablement signal generation circuit latches an internal command in response to a first pre-control signal and outputs the latched internal command as an output enablement signal in response to an operation clock signal and a second pre-control signal. The output enablement signal generation circuit generates the first pre-control signal according to an internal clock signal and an input clock signal. The data I/O circuit receives input data and output the received input data as output data synchronized with a strobe signal in response to the output enablement signal.

20 Claims, 10 Drawing Sheets

(56) References Cited

U.S. PATENT DOCUMENTS

| | | | |
|---|---|---|---|
| 2015/0381341 A1* | 12/2015 | Chen | H04L 7/0087 |
| | | | 375/375 |
| 2016/0036426 A1* | 2/2016 | Grabinski | H03K 5/135 |
| | | | 327/158 |
| 2016/0087638 A1* | 3/2016 | Chae | H03L 7/085 |
| | | | 327/158 |
| 2018/0083641 A1* | 3/2018 | Ryu | G06F 1/10 |
| 2018/0165098 A1* | 6/2018 | Hong | G06F 9/3869 |

\* cited by examiner

SEMICONDUCTOR DEVICES

CROSS-REFERENCE TO RELATED APPLICATION

The present application claims priority under 35 U.S.C. 119(a) to Korean Patent Application No. 10-2016-0175758, filed on Dec. 21, 2016, which is incorporated herein by reference in its entirety.

BACKGROUND

1. Technical Field

Embodiments of the present disclosure relate to semiconductor devices controlling input/output of signals of a pipe latch circuit using a signal generated by a replica delay circuit.

2. Related Art

Fast semiconductor devices are increasingly desirable with the improvement of their integration density. Double data rate (DDR) synchronous dynamic random access memory (DRAM) devices operating in synchronization with rising edges and falling edges of a clock signal have increased the operation speed thereof. Data strobe signals may be used in the DDR synchronous DRAM devices to minimize timing margin loss, which results from a timing skew between DDR synchronous DRAM devices, a variation of an access time according to alteration of process/voltage/temperature (PVT) conditions, and a variation of a propagation delay time of signals between a controller and the DDR synchronous DRAM devices.

Semiconductor devices operating in synchronization with a clock signal may include a clock generation circuit generating an internal clock signal, which is used in internal operations of the semiconductor devices, from an external clock signal. Typically, the clock generation circuit may include a delay locked loop (DLL) circuit and a phase locked loop (PLL) circuit.

SUMMARY

Various embodiments are directed to semiconductor devices.

According to an embodiment, a semiconductor device includes a phase comparison circuit, an output enablement signal generation circuit and a data input/output (I/O) circuit. The phase comparison circuit compares a phase of a clock signal with a phase of a delay locked loop (DLL) clock signal to generate a phase information signal. The output enablement signal generation circuit latches an internal command in response to a first pre-control signal generated from an internal clock signal and an input clock signal. In addition, the output enablement signal generation circuit outputs the latched internal command as an output enablement signal in response to an operation clock signal and a second pre-control signal. The operation clock signal is generated by delaying the internal clock signal by a delay time set according to the phase information signal, and the second pre-control signal is generated by delaying the first pre-control signal by a delay time set according to the phase information signal. The data input/output (I/O) circuit is synchronized with a strobe signal to output input data as output data in response to the output enablement signal.

According to another embodiment, a semiconductor device includes a pre-control signal generation circuit and an input/output (I/O) control signal generation circuit. The pre-control signal generation circuit generates a first pre-control signal from an input clock signal in synchronization with an internal clock signal. In addition, the pre-control signal generation circuit delays the internal clock signal using a first delay circuit to generate an operation clock signal. Moreover, the pre-control signal generation circuit delays the first pre-control signal using a second delay circuit to generate a second pre-control signal. The input/output (I/O) control signal generation circuit generates an input control signal controlling a signal input operation of a pipe latch circuit according to the internal clock signal and the first pre-control signal. In addition, the input/output (I/O) control signal generation circuit generates an output control signal controlling a signal output operation of the pipe latch circuit according to the operation clock signal and the second pre-control signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
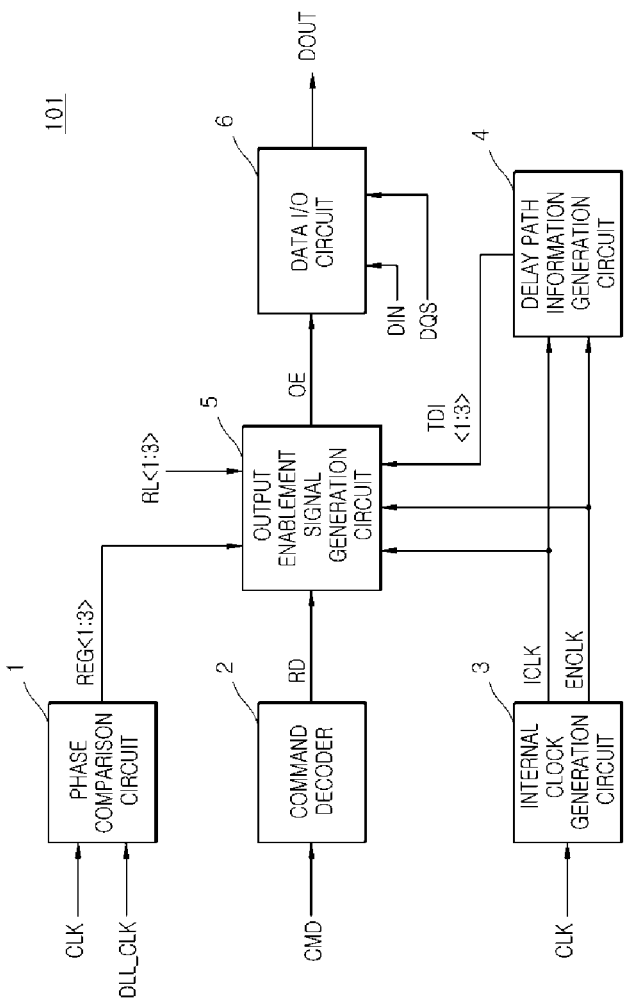
FIG. 1 is a block diagram illustrating a semiconductor device according to an embodiment.

FIG. 1 is a block diagram illustrating a semiconductor device 101 according to an embodiment. As illustrated in FIG. 1, the semiconductor device 101 may include a phase comparison circuit 1, a command decoder 2, an internal clock generation circuit 3, a delay path information generation circuit 4, an output enablement signal generation circuit 5, and a data input/output (I/O) circuit 6.

The phase comparison circuit 1 may compare a phase of a clock signal CLK with a phase of a delay locked loop (DLL) clock signal DLL_CLK to generate a phase information signal REG<1:3>. The phase comparison circuit 1 may generate the phase information signal REG<1:3> indicating a phase difference between the clock signal CLK and the DLL clock signal DLL_CLK. The clock signal CLK may be provided from an external device and may be a toggling signal. The DLL clock signal DLL_CLK may be a signal which is generated by a DLL circuit (not shown) included in the semiconductor device 101. The clock signal CLK and the DLL clock signal DLL_CLK may have different phases (i.e., having a phase difference with respect to each other). The DLL clock signal DLL_CLK may have substantially the same phase as a data strobe signal DQS, as will be described later. A number of bits included in the phase information signal REG<1:3> may vary according to embodiments.

The command decoder 2 may decode a command CMD to generate an internal command RD. The command CMD may be a signal output from a controller (not shown), which controls an operation of the semiconductor device 101 or a test equipment (not shown) evaluating various characteristics of the semiconductor device 101. The command CMD may be transmitted through signal lines that transmit at least one of an address, a command, and data. In an embodiment, the command CMD may be a signal having a plurality of bits. The internal command RD may be a command for initiating a read operation mode of the semiconductor device 101. The internal command RD may be one of various commands for initiating various operation modes of the semiconductor device 101.

The internal clock generation circuit 3 may generate an internal clock signal ICLK which is periodically toggled in response to the clock signal CLK. The internal clock generation circuit 3 may generate an input clock signal ENCLK which is enabled in synchronization with the internal clock signal ICLK. The internal clock signal ICLK may be have substantially the same frequency as the clock signal CLK. The internal clock signal ICLK may be a signal which is toggled to have substantially the same cycle time as the clock signal CLK. In an embodiment, the internal clock signal ICLK is an inverted version of the clock signal CLK. The input clock signal ENCLK may be enabled to have a specific logic level in synchronization with the internal clock signal ICLK. The specific logic level of the input clock signal ENCLK may vary according to embodiments.

The delay path information generation circuit 4 may generate a path information signal TDI<1:3> indicating an internal delay time, in response to the input clock signal ENCLK. A number of bits included in the path information signal TDI<1:3> may vary according to embodiments. The internal delay time may be a sum of a delay time of the command decoder 2 to generate the internal command RD, a delay time of each of first and second delay circuits (e.g. first and second delay circuits 512 and 513 of FIG. 4) included in the output enablement signal generation circuit 5, and a delay time of the data I/O circuit 6.

The output enablement signal generation circuit 5 may latch the internal command RD to generate an output enablement signal OE, in response to the internal clock signal ICLK and the input clock signal ENCLK. The output enablement signal generation circuit 5 may latch the internal command RD in response to a first pre-control signal (e.g., a first pre-control signal PPI of FIG. 4) and the internal clock signal ICLK. The first pre-control signal may be generated based on the internal clock signal ICLK and the input clock signal ENCLK. The output enablement signal generation circuit 5 may output the latched internal command RD as the output enablement signal OE in response to an operation clock signal (e.g., an operation clock signal DCLK of FIG. 4) and a second pre-control signal (e.g. a second pre-control signal PPO of FIG. 4). The operation clock signal may be generated by delaying the internal clock signal ICLK. The second pre-control signal may be generated by delaying the first pre-control signal.

The data I/O circuit 6 may produce output data DOUT synchronized with the strobe signal DQS in response to the output enablement signal OE. The data I/O circuit 6 may be synchronized with the strobe signal DQS to latch the input data DIN when the output enablement signal OE is enabled. The data I/O circuit 6 may be synchronized with the strobe signal DQS to output the latched input data DIN as the output data DOUT when the output enablement signal OE is enabled. The output data DOUT may be data output from the semiconductor device 101 or data stored into a memory circuit (not shown) of the semiconductor device.

Figure 2:
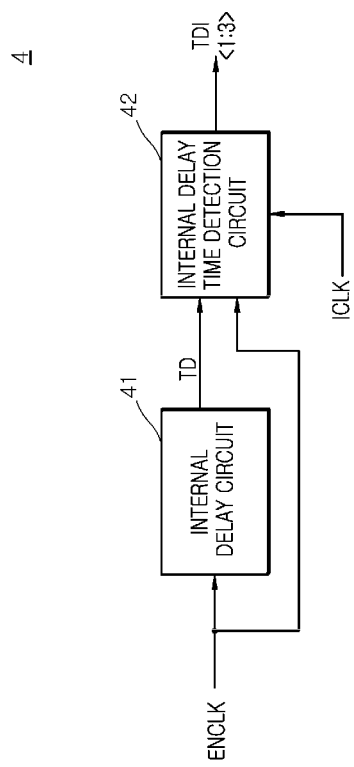
FIG. 2 is a block diagram illustrating an example of a delay path information generation circuit included in the semiconductor device of FIG. 1.

FIG. 2 is a block diagram illustrating an example of the delay path information generation circuit 4 included in the semiconductor device 101 of FIG. 1. Referring to FIG. 2, the delay path information generation circuit 4 may include an internal delay circuit 41, and an internal delay time detection circuit 42.

The internal delay circuit 41 may delay the input clock signal ENCLK to generate a transmission signal TD. The internal delay circuit 41 may be implemented using a replica delay circuit replicating an internal delay time of a semiconductor device (e.g., the semiconductor device 101 of FIG. 1). For example, the internal delay time may be determined as a sum of a delay time of the command decoder 2 to generate the internal command RD from the command CMD, a delay time of each of first and second delay circuits (e.g., the first and second delay circuits 512 and 513 of FIG. 4) included in the output enablement signal generation circuit 5, and a delay time of the data I/O circuit 6.

The internal delay time detection circuit 42 may generate the path information signal TDI<1:3> according to a number of times at which the internal clock signal ICLK is toggled during a specific time interval. For example, the internal delay time detection circuit 42 may generate the path information signal TDI<1:3> by counting a number of pulses of the internal clock signal ICLK during the time interval from a first time at which the input clock signal ENCLK is enabled to a second time at which the transmission signal TD is enabled. The path information signal TDI<1:3> may indicate information on the internal delay time of the semiconductor device.

Figure 3:
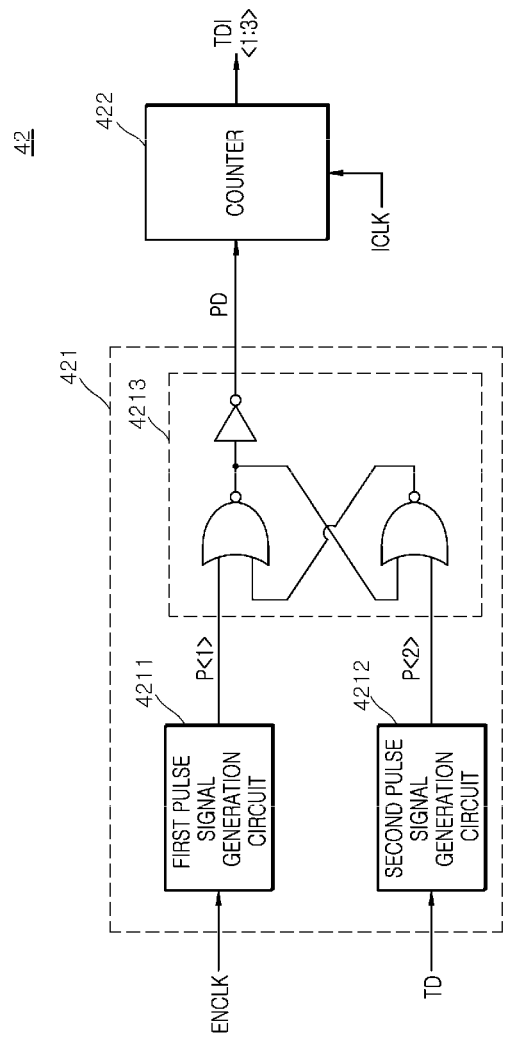
FIG. 3 is a block diagram illustrating an example of an internal delay time detection circuit included in the delay path information generation circuit of FIG. 2 according to an embodiment.

FIG. 3 is a block diagram illustrating an example of the internal delay time detection circuit 42 included in the delay path information generation circuit 4 of FIG. 2. Referring to FIG. 3, the internal delay time detection circuit 42 may include a period signal generation circuit 421 and a counter 422.

The period signal generation circuit 421 may include a first pulse signal generation circuit 4211, a second pulse signal generation circuit 4212, and a latch circuit 4213.

The first pulse signal generation circuit 4211 may generate a first pulse signal P<1> having a predetermined pulse width in response to the input clock signal ENCLK. The first pulse signal generation circuit 4211 may generate the first pulse signal P<1> having a logic high value in response to the input clock signal ENCLK transitioning to a logic high value.

The second pulse signal generation circuit 4212 may generate a second pulse signal P<2> having a predetermined pulse width in response to the transmission signal TD. The second pulse signal generation circuit 4212 may generate the second pulse signal P<2> having a logic high value in response to the transmission signal TD transitioning to a logic high value.

The latch circuit 4213 may generate a period signal PD which is enabled in response to the first and second pulse signals P<1:2>. The latch circuit 4213 may generate the period signal PD which is enabled from a first time at which the latch circuit 4213 receives a pulse of the first pulse signal P<1> to a second time at which the latch circuit 4213 receives a pulse of the second pulse signal P<2>. For example, the latch circuit 4213 may generate the period signal PD having a value that transitions from a logic low value into a logic high value at the first time when the latch circuit 4213 receives the first pulse signal P<1> having the logic high value. The latch circuit 4213 may generate the period signal PD having the value that transitions from the logic high value into the logic low value at the second time when the latch circuit 4213 receives the second pulse signal P<2> having the logic high value. That is, an enabled period of the period signal PD may be a period that the period signal PD has the logic high value. However, in another embodiment, the enabled period of the period signal PD may be a period that the period signal PD has the logic low value.

The counter 422 may generate the path information signal TDI<1:3> by counting a number of pulses of the internal clock signal ICLK during the enabled period of the period signal PD. The counter 422 may generate the path information signal TDI<1:3> indicating the number of times at which the internal clock signal ICLK is toggled when the period signal PD has the logic high value.

Figure 4:
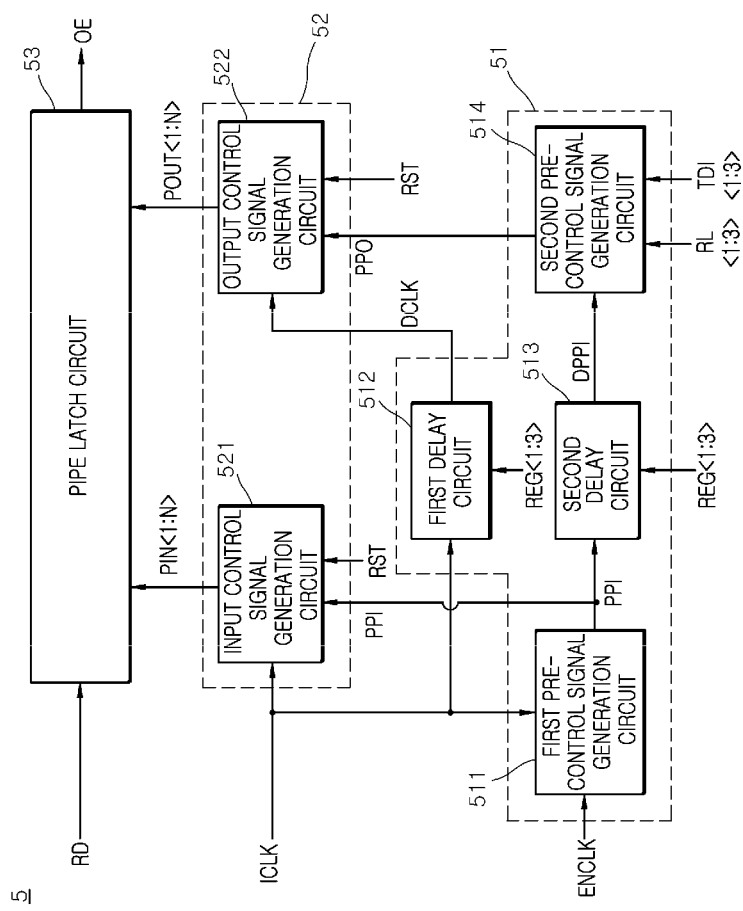
FIG. 4 is a block diagram illustrating an example of an output enablement signal generation circuit included in the semiconductor device of FIG. 1.

FIG. 4 is a block diagram illustrating an example of the output enablement signal generation circuit 5 included in the semiconductor device 101 of FIG. 1. Referring to FIG. 4, the output enablement signal generation circuit 5 may include a pre-control signal generation circuit 51, an I/O control signal generation circuit 52, and a pipe latch circuit 53.

The pre-control signal generation circuit 51 may include a first pre-control signal generation circuit 511, a first delay circuit 512, a second delay circuit 513, and a second pre-control signal generation circuit 514.

The first pre-control signal generation circuit 511 may latch the input clock signal ENCLK to generate a first pre-control signal PPI, in synchronization with the internal clock signal ICLK. In an embodiment, the first pre-control signal generation circuit 511 may latch the input clock signal ENCLK to generate the first pre-control signal PPI having a logic high value, in synchronization with a falling edge of the internal clock signal ICLK. The first pre-control signal generation circuit 511 may be implemented using a flip-flop. In another embodiment, the first pre-control signal generation circuit 511 may be configured to latch the input clock signal ENCLK to generate the first pre-control signal PPI having the logic high value, in synchronization with a rising edge of the internal clock signal ICLK.

The first delay circuit 512 may delay the internal clock signal ICLK by a first delay amount to generate the operation clock signal DCLK, the first delay amount being determined according to the phase information signal REG<1:3>. The first delay circuit 512 may generate the operation clock signal DCLK having the same phase as the DLL clock signal DLL_CLK according to the phase information signal REG<1:3> indicative of a phase difference between the clock signal CLK and the DLL clock signal DLL_CLK.

The second delay circuit 513 may delay the first pre-control signal PPI by a second delay amount to generate a delay control signal DPPI, the second delay amount being determined according to the phase information signal REG<1:3>. The second delay circuit 513 may generate the delay control signal DPPI having substantially the same phase as the DLL clock signal DLL_CLK according to the phase information signal REG<1:3> indicative of the phase difference between the clock signal CLK and the DLL clock signal DLL_CLK.

Meanwhile, the first delay circuit 512 and the second delay circuit 513 may be implemented with replica delay circuits to have the same configuration. Thus, the operation clock signal DCLK and the delay control signal DPPI may have substantially the same phase, such that a transition of the operation clock signal DCLK and a transition of the delay control signal DPPI occur concurrently.

The second pre-control signal generation circuit 514 may delay the delay control signal DPPI by a third delay amount to generate a second pre-control signal PPO, the third delay amount being determined according to a read latency signal RL<1:3> and the path information signal TDI<1:3>.

The I/O control signal generation circuit 52 may include an input control signal generation circuit 521 and an output control signal generation circuit 522.

The input control signal generation circuit 521 may generate an input control signal (or first to $N^{th}$ input control signals) PIN<1:N>, which is enabled in synchronization with the internal clock signal ICLK in response to the first pre-control signal PPI. For example, the input control signal generation circuit 521 may generate the first to $N^{th}$ input control signals PIN<1:N>, which are sequentially enabled in synchronization with the internal clock signal ICLK, when the first pre-control signal PPI is enabled. The input control signal generation circuit 521 may initialize the input control signal PIN<1:N> in response to a reset signal RST. The initialization of the input control signal PIN<1:N> may indicate that all of the first to $N^{th}$ input control signals PIN<1:N> are disabled (e.g., to have a logic low value). The number N of bits included in the input control signals PIN<1:N> may vary according to embodiments. The reset signal RST may be generated when the semiconductor device performs an initialization operation or after all of the first to $N^{th}$ input control signals PIN<1:N> and first to $N^{th}$ output control signals POUT<1:N> have been sequentially enabled.

The output control signal generation circuit 522 may generate an output control signal (or the first to $N^{th}$ output control signals) POUT<1:N>, which is enabled in synchronization with the operation clock signal DCLK, in response to the second pre-control signal PPO. For example, the output control signal generation circuit 522 may generate the first to $N^{th}$ output control signals POUT<1:N>, which are sequentially enabled in synchronization with the operation clock signal DCLK, when the second pre-control signal PPO is enabled. The output control signal generation circuit 522 may initialize the output control signal POUT<1:N> in response to the reset signal RST. The initialization of the output control signal POUT<1:N> may indicate that all of the first to $N^{th}$ output control signals POUT<1:N> are disabled. The number N of bits included in the output control signals POUT<1:N> may vary according to embodiments. The reset signal RST may be generated when the semiconductor device performs an initialization operation or after all of the first to $N^{th}$ input control signals PIN<1:N> and the first to $N^{th}$ output control signals POUT<1:N> have been sequentially enabled.

The pipe latch circuit 53 may output the internal command RD as the output enablement signal OE in response to the input control signal PIN<1:N> and the output control signal POUT<1:N>. The pipe latch circuit 53 may latch the internal command RD in response to the input control signal PIN<1:N>. The pipe latch circuit 53 may output the latched internal command RD as the output enablement signal OE in response to the output control signal POUT<1:N>. The pipe latch circuit 53 may be implemented using a first-in-first-out (FIFO) circuit, which operates such that the oldest entry that has been input first is processed first. As a result, the FIFO circuit may be configured such that data that has been input first are output first.

An operation of the pipe latch circuit 53 based on a FIFO scheme will be described in more detail hereinafter.

The pipe latch circuit 53 may output the internal command RD latched at a first time at which a pulse of the first output control signal POUT<1> is generated as the output enablement signal OE, after the internal command RD is input at a second time at which a pulse of the first input control signal PIN<1> is generated. Similarly, the pipe latch circuit 53 may output the internal command RD latched at a third time at which a pulse of the $N^{th}$ output control signal POUT<N> is generated as the output enablement signal OE, the third time being subsequent to the first time, after the internal command RD is input at a fourth time at which the $N^{th}$ input control signal PIN<N> is generated, the fourth time being subsequent to the second time.

Figure 5:
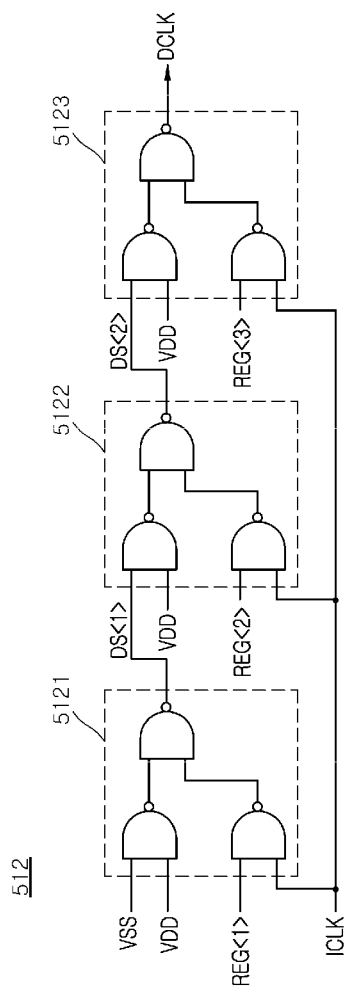
FIG. 5 is a circuit diagram illustrating an example of a first delay circuit included in the output enablement signal generation circuit of FIG. 4.

FIG. 5 is a circuit diagram illustrating an example of the first delay circuit 512 included in the output enablement signal generation circuit 5 of FIG. 4. Referring to FIG. 5, the first delay circuit 512 may include a first unit delay circuit 5121, a second unit delay circuit 5122, and a third unit delay circuit 5123.

The first unit delay circuit 5121 may output the internal clock signal ICLK as a first delay signal DS<1> in response to a ground voltage VSS and a power supply voltage VDD, when the first phase information signal REG<1> has a logic high value. The first unit delay circuit 5121 may generate the first delay signal DS<1> which is disabled to have a logic low value in response to the ground voltage VSS and the power supply voltage VDD, when the first phase information signal REG<1> has a logic low value.

The second unit delay circuit 5122 may output the internal clock signal ICLK as a second delay signal DS<2> in response to the first delay signal DS<1> and the power supply voltage VDD, when the second phase information signal REG<2> has a logic high value. The second unit delay circuit 5122 may output the first delay signal DS<1> as the second delay signal DS<2> in response to the power supply voltage VDD, when the second phase information signal REG<2> has a logic low value.

The third unit delay circuit 5123 may output the internal clock signal ICLK as the operation clock signal DCLK in response to the second delay signal DS<2> and the power supply voltage VDD, when the third phase information signal REG<3> has a logic high value. The third unit delay circuit 5123 may output the second delay signal DS<2> as the operation clock signal DCLK in response to the power supply voltage VDD, when the third phase information signal REG<3> has a logic low value.

Although the embodiment shown in FIG. 5 is configured to include the first to third unit delay circuits 5121, 5122, and 5123, embodiments of the present disclosure are not limited thereto. The number of unit delay circuits included in the first delay circuit 512 may vary according to embodiments.

Figure 6:
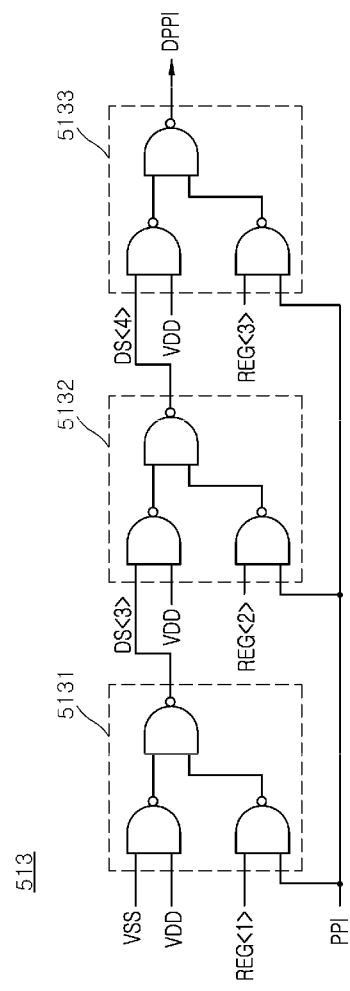
FIG. 6 is a circuit diagram illustrating an example of a second delay circuit included in the output enablement signal generation circuit of FIG. 4.

FIG. 6 is a circuit diagram illustrating an example of the second delay circuit 513 included in the output enablement signal generation circuit 5a of FIG. 4. Referring to FIG. 6, the second delay circuit 513 may include a fourth unit delay circuit 5131, a fifth unit delay circuit 5132, and a sixth unit delay circuit 5133.

The fourth unit delay circuit 5131 may output the first pre-control signal PPI as a third delay signal DS<3> in response to the ground voltage VSS and the power supply voltage VDD, when the first phase information signal REG<1> has a logic high value. The fourth unit delay circuit 5131 may generate the third delay signal DS<3> which is disabled to have a logic low value in response to the ground voltage VSS and the power supply voltage VDD, when the first phase information signal REG<1> has a logic low value.

The fifth unit delay circuit 5132 may output the first pre-control signal PPI as a fourth delay signal DS<4> in response to the third delay signal DS<3> and the power supply voltage VDD, when the second phase information signal REG<2> has a logic high value. The fifth unit delay circuit 5132 may output the third delay signal DS<3> as the fourth delay signal DS<4> in response to the power supply voltage VDD, when the second phase information signal REG<2> has a logic low value.

The sixth unit delay circuit 5133 may output the first pre-control signal PPI as the delay control signal DPPI in response to the fourth delay signal DS<4> and the power supply voltage VDD, when the third phase information signal REG<3> has a logic high value. The sixth unit delay circuit 5133 may output the fourth delay signal DS<4> as the delay control signal DPPI in response to the power supply voltage VDD, when the third phase information signal REG<3> has a logic low value.

Although the embodiment shown in FIG. 6 is configured to include the fourth to sixth unit delay circuits 5131, 5132, and 5133, embodiments of the present disclosure are not limited thereto. The number of unit delay circuits included in the second delay circuit 513 may vary according to embodiments.

Figure 7:
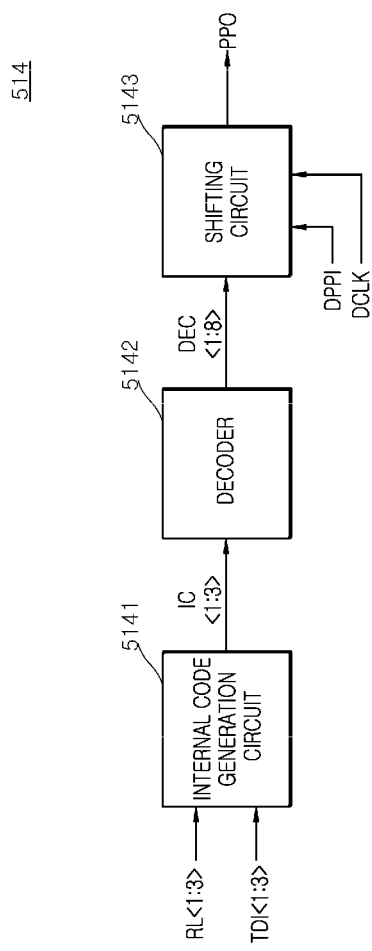
FIG. 7 is a block diagram illustrating an example of a second pre-control signal generation circuit included in the output enablement signal generation circuit of FIG. 4.

FIG. 7 is a block diagram illustrating an example of the second pre-control signal generation circuit 514 included in the output enablement signal generation circuit of FIG. 4. Referring to FIG. 7, the second pre-control signal generation circuit 514 may include an internal code generation circuit 5141, a decoder 5142, and a shifting circuit 5143.

The internal code generation circuit 5141 may perform an arithmetic operation on the read latency signal RL<1:3> and the path information signal TDI<1:3> to generate an internal code IC<1:3>. The internal code generation circuit 5141 may subtract a value of the path information signal TDI<1:3> from a value of the read latency signal RL<1:3> to generate the internal code IC<1:3>. The internal code generation circuit 5141 may generate the internal code IC<1:3> indicating a delay time that is obtained by subtracting an internal delay time from a read latency period.

The decoder 5142 may decode the internal code IC<1:3> to generate first to eighth decoded signals DEC<1:8>. The decoder 5142 may decode the internal code IC<1:3> to generate the first to eighth decoded signals DEC<1:8>, one of which is selectively enabled. The decoder 5142 may be realized using a general decoder that receives N number of signals and generates $2^N$ number of signals, N denoting a natural number.

The shifting circuit 5143 may delay the delay control signal DPPI by a delay time to generate the second pre-control signal PPO in synchronization with the operation clock signal DCLK. The delay time is determined according to the first to eighth decoded signals DEC<1:8>.

Figure 8:
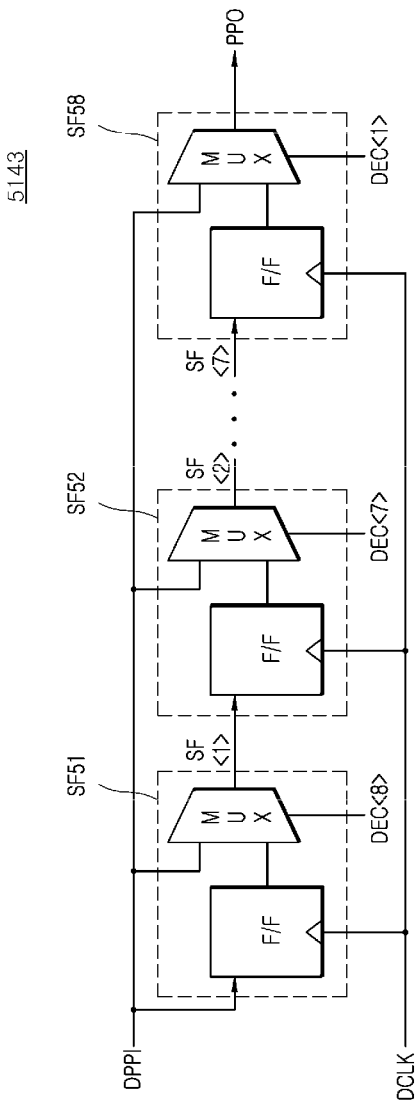
FIG. 8 is a block diagram illustrating an example of a shifting circuit included in the second pre-control signal generation circuit of FIG. 7.

FIG. 8 is a block diagram illustrating an example of the shifting circuit 5143 included in the second pre-control signal generation circuit 514 of FIG. 7. Referring to FIG. 8, the shifting circuit 5143 may include first to eighth unit shifting circuits SF51 to SF58.

The first unit shifting circuit SF51 may delay the delay control signal DPPI by one cycle of the operation clock signal DCLK to generate a first shifted signal SF<1>, when the eighth decoded signal DEC<8> is disabled (e.g., the eighth decoded signal DEC<8> has a logic low value). The first unit shifting circuit SF51 may output the delay control signal DPPI as the first shifted signal SF<1> if the eighth decoded signal DEC<8> is enabled (e.g., the eighth decoded signal DEC<8> has a logic high value).

The second unit shifting circuit SF52 may delay the first shifted signal SF<1> by one cycle of the operation clock signal DCLK to generate a second shifted signal SF<2>, when the seventh decoded signal DEC<7> is disabled. The second unit shifting circuit SF52 may output the delay control signal DPPI as the second shifted signal SF<2> when the seventh decoded signal DEC<7> is enabled.

The third unit shifting circuit SF53 (not shown) may delay the second shifted signal SF<2> by one cycle of the operation clock signal DCLK to generate a third shifted signal SF<3> (not shown), when the sixth decoded signal DEC<6> is disabled. The third unit shifting circuit SF53 may output the delay control signal DPPI as the third shifted signal SF<3> when the sixth decoded signal DEC<6> is enabled.

The fourth unit shifting circuit SF54 (not shown) may delay the third shifted signal SF<3> by one cycle of the operation clock signal DCLK to generate a fourth shifted signal SF<4> (not shown), when the fifth decoded signal DEC<5> is disabled. The fourth unit shifting circuit SF54 may output the delay control signal DPPI as the fourth shifted signal SF<4> when the fifth decoded signal DEC<5> is enabled.

The fifth unit shifting circuit SF55 (not shown) may delay the fourth shifted signal SF<4> by one cycle of the operation clock signal DCLK to generate a fifth shifted signal SF<5> (not shown), when the fourth decoded signal DEC<4> is disabled. The fifth unit shifting circuit SF55 may output the delay control signal DPPI as the fifth shifted signal SF<5> when the fourth decoded signal DEC<4> is enabled.

The sixth unit shifting circuit SF56 (not shown) may delay the fifth shifted signal SF<5> by one cycle of the operation clock signal DCLK to generate a sixth shifted signal SF<6> (not shown), when the third decoded signal DEC<3> is disabled. The sixth unit shifting circuit SF56 may output the delay control signal DPPI as the sixth shifted signal SF<6> when the third decoded signal DEC<3> is enabled.

The seventh unit shifting circuit SF57 (not shown) may delay the sixth shifted signal SF<6> by one cycle of the operation clock signal DCLK to generate a seventh shifted signal SF<7>, when the second decoded signal DEC<2> is disabled. The seventh unit shifting circuit SF57 may output the delay control signal DPPI as the seventh shifted signal SF<7> when the second decoded signal DEC<2> is enabled.

The eighth unit shifting circuit SF58 may delay the seventh shifted signal SF<7> by one cycle of the operation clock signal DCLK to generate the second pre-control signal PPO, when the first decoded signal DEC<1> is disabled. The eighth unit shifting circuit SF58 may output the delay control signal DPPI as the second pre-control signal PPO when the first decoded signal DEC<1> is enabled.

An operation of the shifting circuit 5143 for delaying the delay control signal DPPI by a delay time to generate the second pre-control signal PPO, the delay time being determined according to the decoded signals DEC<1:8>, will be described in more detail hereinafter.

The shifting circuit 5143 may delay the delay control signal DPPI by the delay time corresponding to seven cycles of the operation clock signal DCLK to generate the second pre-control signal PPO, when the eighth decoded signal DEC<8> is selectively enabled (e.g., values of the first to eighth decode signals DEC<1:8> are [0 0 0 0 0 0 0 1]). The shifting circuit 5143 may output the delay control signal DPPI as the second pre-control signal PPO without a significant delay when the first decoded signal DEC<1> is selectively enabled (e.g., the values of the first to eighth decode signals DEC<1:8> are [1 0 0 0 0 0 0 0]). In addition, the shifting circuit 5143 may delay the delay control signal DPPI by eight cycles of the operation clock signal DCLK to generate the second pre-control signal PPO when all of the first to eighth decoded signals DEC<1:8> are disabled (e.g. the values of the first to eighth decode signals DEC<1:8> are [0 0 0 0 0 0 0 0]), during an initialization operation.

Figure 9:
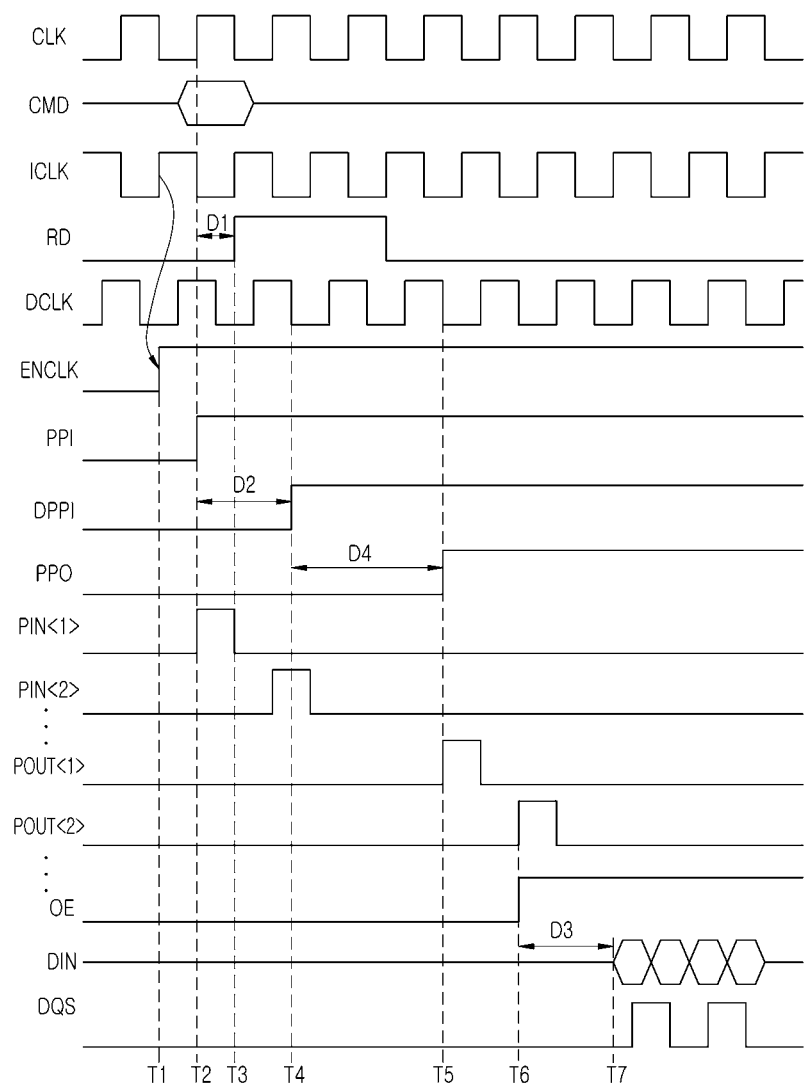
FIG. 9 is a timing diagram illustrating an operation of a semiconductor device according to an embodiment.

FIG. 9 is a timing diagram illustrating an operation of the semiconductor device 101 of FIG. 1 according to an embodiment. An operation of the semiconductor device 101 having the aforementioned configuration will be described hereinafter with reference to FIGS. 1 and 9. In this embodiment, the I/O operation of the pipe latch circuit 53 of FIG. 4 is controlled by the first and second delay circuits 512 and 513 of FIG. 4, which have substantially the same configuration and substantially the same delay time to output the latched input data DIN as the output data DOUT.

The phase comparison circuit 1 of FIG. 1 may compare a phase of the clock signal CLK with a phase of the DLL clock signal DLL_CLK to generate the phase information signal REG<1:3>. The phase information signal REG<1:3> may be generated to include information on a phase difference between the clock signal CLK and the DLL clock signal DLL_CLK.

The internal clock generation circuit 3 of FIG. 1 may generate the internal clock signal ICLK that is periodically toggled in response to the clock signal CLK.

The first delay circuit 512 of the output enablement signal generation circuit 5 shown in FIG. 4 may delay the internal clock signal ICLK by a delay time to generate the operation clock signal DCLK. The delay time is determined according to the phase information signal REG<1:3>.

At a first time T1, the internal clock generation circuit 3 of FIG. 1 may generate the input clock signal ENCLK which is enabled to have a logic high value in synchronization with a rising edge of the internal clock signal ICLK.

At a second time T2, the first pre-control signal generation circuit 511 of the output enablement signal generation circuit 5 shown in FIG. 4 may latch the input clock signal ENCLK to generate the first pre-control signal PPI having a logic high value, in synchronization with the internal clock signal ICLK.

The input control signal generation circuit 521 of the output enablement signal generation circuit 5 shown in FIG. 4 may generate the first to N$^{th}$ input control signals PIN<1:N>. The first to N$^{th}$ input control signals PIN<1:N> may be sequentially enabled in synchronization with the internal clock signal ICLK in response to the first pre-control signal PPI having a logic high value.

At a third time T3, the command decoder 2 of FIG. 1 may output the internal command RD by decoding the command CMD. A time interval from the second time T2 to the third time T3 may correspond to a first delay time D1 (or a first delay amount) of the decoder 2 to generate the internal command RD based on the command CMD.

At a time between the third time T3 and a fourth time T4, the second input control signal PIN<2> is enabled, and the pipe latch circuit 53 of the output enablement signal generation circuit 5 shown in FIG. 4 may latch the internal command RD in response to the second input control signal PIN<2>.

At the fourth time T4, the second delay circuit 513 of the output enablement signal generation circuit 5 shown in FIG. 4 may generate the delay control signal DPPI having a logic high value by delaying the first pre-control signal PPI by a second delay time (or a second delay amount) D2, the second delay time D2 being determined according to the phase information signal REG<1:3>. Since the delay control signal DPPI is generated in synchronization with the operation clock signal DCLK, the delay control signal DPPI may be set to have the same phase as the operation clock signal DCLK.

The second delay time D2 corresponds to a time interval from the second time T2 to the fourth time T4. Because the first and second delay circuits 512 and 513 of FIG. 4 have substantially the same configuration, each of the first and second delay circuits (512 and 513 of FIG. 4) has the second delay time D2.

At a fifth time T5, the second pre-control signal generation circuit 514 of the output enablement signal generation circuit 5 shown in FIG. 4 may delay the delay control signal DPPI by a fourth delay time D4 to generate the second pre-control signal PPO having a logic high value. The fourth time delay D4 is determined according to the read latency signal RL<1:3> and the path information signal TDI<1:3>. The delay control signal DPPI has been enabled in synchronization with the operation clock signal DCLK, and thus the delay control signal DPPI has substantially the same phase as the operation clock signal DCLK with respect to the internal clock signal ICLK. The second pre-control signal PPO is generated by delaying the delay control signal DPPI by a multiple of a cycle of the operation clock signal DCLK, which has substantially the same cycle time as the internal clock signal ICLK. As a result, the second pre-control signal PPO may have the same phase as the delay control signal DPPI with respect to the internal clock signal ICLK. The fourth delay time D4 corresponds to a time interval from the fourth time T4 to the fifth time T5. The fourth delay time D4 may be determined by subtracting the internal delay time from the read latency period. The internal delay time may be a sum of the first delay time D1 of the command decoder 2, the second delay time D2 of each of the first and second delay circuits 512 and 513 of FIG. 4, and a third delay time D3 of the data I/O circuit 6.

In addition, at the fifth time T5, the output control signal generation circuit 522 of the output enablement signal generation circuit 5 shown in FIG. 4 may start to generate the first to N$^{th}$ output control signals POUT<1:N>. The first to N$^{th}$ output control signals POUT<1:N> are sequentially enabled in synchronization with the operation clock signal DCLK, in response to the second pre-control signal PPO having a logic high value.

At a sixth time T6, the pipe latch circuit 53 may output the internal command RD latched by the second input control signal PIN<2> as the output enablement signal OE, in response to the second output control signal POUT<2> having a logic high value.

At a seventh time T7, the data I/O circuit 6 may be synchronized with the strobe signal DQS to output the input data DIN as the output data DOUT, in response to the output enablement signal OE having a logic high value. A time interval from the sixth time T6 to the seventh time T7 may correspond to the third delay time D3 of the data I/O circuit 6.

The semiconductor device 101 of FIG. 1 having the aforementioned configuration may control a data I/O operation of the pipe latch circuit 53 of FIG. 4 using signals generated by the first and second delay circuits 512 and 513, which have substantially the same configuration to have substantially the same delay time. The first delay circuit 512 delays the internal clock signal ICLK to generate the operation clock signal DCLK. The second delay circuit 513 delays the first pre-control signal PPI, which has been enabled in synchronization with the internal clock signal ICLK, to generate the delay control signal DPPI. Because the first and second delay circuits 512 and 513 have the substantially same delay time, the delay control signal DPPI transitions in synchronization with the operation clock signal DCLK. The input control signal generation circuit 521 generates the first to N$^{th}$ input control signals PIN<1:N> in synchronization with the internal clock signal ICLK. The output control signal generation circuit 522 generates the first to N$^{th}$ output control signals POUT<1:N> in synchronization with the operation clock signal DCLK, which is a delayed version of the internal clock signal ICLK by the first delay circuit 512. The first to N$^{th}$ input control signals PIN<1:N> and the first to N$^{th}$ output control signals POUT<1:N> are generated based on the internal clock signal ICLK and the replicated first and second delay circuits 512 and 513 are used to generate the first to N$^{th}$ output control signals POUT<1:N>, reliability of the pipe latch circuit 53 operating in response to the first to N$^{th}$ input control signals PIN<1:N> and the first to N$^{th}$ output control signals POUT<1:N> may be improved.

Figure 10:
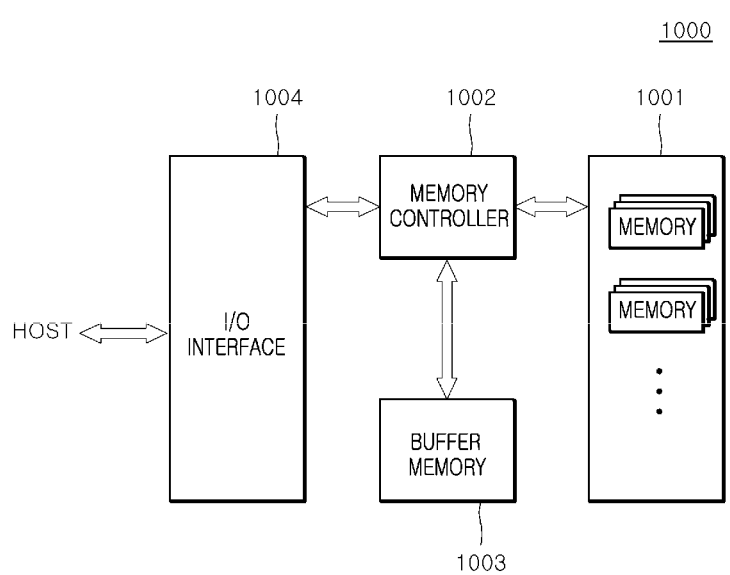
FIG. 10 is a block diagram illustrating a configuration of an electronic system employing the semiconductor device of FIG. 1 according to an embodiment.

The semiconductor device described above with reference to FIGS. 1 to 9 may be applied to an electronic system that includes a memory system, a graphic system, a computing system, a mobile system, or the like. For example, FIG. 10 is a block diagram illustrating a configuration of an electronic system 1000 employing the semiconductor device of FIG. 1 according to an embodiment. The electronic system 1000 may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 10 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a phase comparison circuit configured to compare a phase of a clock signal with a phase of a delay locked loop (DLL) clock signal to generate a phase information signal;
   an output enablement signal generation circuit configured to latch an internal command in response to a first pre-control signal and configured to output the latched internal command as an output enablement signal in response to an operation clock signal and a second pre-control signal, the output enablement signal generation circuit generating the first pre-control signal according to an internal clock signal and an input clock signal, the output enablement signal generation circuit generating the operation clock signal by delaying the internal clock signal by a first delay amount, the first delay amount being determined according to the phase information signal, the output enablement signal generating circuit generating the second pre-control signal by delaying the first pre-control signal by the first delay amount; and
   a data input/output (I/O) circuit configured to receive input data and output the received input data as output data synchronized with a strobe signal in response to the output enablement signal.

2. The semiconductor device of claim 1, wherein the output enablement signal generation circuit includes:
   a first delay circuit configured to delay the internal clock signal by the first delay amount; and
   a second delay circuit to delay the first pre-control signal by the first delay amount, the second delay circuit having the same configuration as the first delay circuit.

3. The semiconductor device of claim 1, wherein the clock signal and the DLL clock signal have different phases with respect to each other.

4. The semiconductor device of claim 1, wherein the DLL clock signal has the substantially same phase as the strobe signal.

5. The semiconductor device of claim 1, wherein the output enablement signal generation circuit includes:
   a pre-control signal generation circuit configured to latch the input clock signal to generate the first pre-control signal in synchronization with the internal clock signal, delay the internal clock signal by the first delay amount to generate the operation clock signal, and delay the first pre-control signal by the first delay amount to generate the second pre-control signal;
   an I/O control signal generation circuit configured to generate an input control signal which is enabled in synchronization with the internal clock signal in response to the first pre-control signal and generate an output control signal which is enabled in synchronization with the operation clock signal in response to the second pre-control signal; and
   a pipe latch circuit configured to latch the internal command in response to the input control signal and output the latched internal command as the output enablement signal in response to the output control signal.

6. The semiconductor device of claim 5, wherein the pre-control signal generation circuit includes:
   a first pre-control signal generation circuit configured to latch the input clock signal in synchronization with the internal clock signal to generate the first pre-control signal;
   a first delay circuit configured to delay the internal clock signal by the first delay amount to generate the operation clock signal;
   a second delay circuit configured to delay the first pre-control signal by the first delay amount to generate a delay control signal according to the phase information signal; and
   a second pre-control signal generation circuit configured to delay the delay control signal by a second delay amount to generate the second pre-control signal, the second delay amount being determined according to a read latency signal and a path information signal.

7. The semiconductor device of claim 6, wherein the second pre-control signal generation circuit includes:
   an internal code generation circuit configured to subtract the path information signal from the read latency signal to generate an internal code, the path information signal indicating an internal delay amount, the read latency signal indicating a read latency period;

a decoder configured to decode the internal code to generate a plurality of decoded signals, at most one of the plurality of decoded signals being selectively enabled; and a shifting circuit configured to delay the delay control signal by the second delay amount to generate the second pre-control signal in synchronization with the operation clock signal.

8. The semiconductor device of claim 6, wherein the second delay circuit generates the delay control signal transitioning between two logic values in synchronization with the operation clock signal.

9. The semiconductor device of claim 5, wherein the I/O control signal generation circuit includes:

an input control signal generation circuit configured to generate the input control signal which is enabled in synchronization with the internal clock signal in response to the first pre-control signal; and an output control signal generation circuit configured to generate the output control signal which is enabled in synchronization with the operation clock signal in response to the second pre-control signal.

10. The semiconductor device of claim 1, further comprising:

an internal clock generation circuit configured to generate the internal clock signal having substantially the same cycle time as the clock signal and configured to generate the input clock signal which is enabled in synchronization with the internal clock signal; and a delay path information generation circuit configured to generate a path information signal including information on an internal delay amount in response to the input clock signal.

11. The semiconductor device of claim 10, wherein the delay path information generation circuit includes:

an internal delay circuit configured to delay the input clock signal by a delay amount substantially equal to the internal delay amount to generate a transmission signal; and an internal delay time detection circuit configured to generate the path information signal in response to the input clock signal and the transmission signal, the path information signal indicating a number of times at which the internal clock signal is toggled during a specific time interval.

12. The semiconductor device of claim 11, wherein the internal delay amount is equal to a sum of the first delay amount, a third delay amount of the data I/O circuit, and a fourth delay amount, a command decoder delaying a command by the fourth delay amount to generate the internal command.

13. The semiconductor device of claim 11, wherein the internal delay time detection circuit includes:

a period signal generation circuit configured to generate a period signal which is enabled during the specific time interval between a first time and a second time, the input clock signal being enabled at the first time, and the transmission signal being enabled at the second time; and a counter configured to count a number of pulses of the internal clock signal during the specific time interval.

14. A semiconductor device comprising:

a pre-control signal generation circuit configured to generate a first pre-control signal from an input clock signal in synchronization with an internal clock signal, delay the internal clock signal to generate an operation clock signal, and delay the first pre-control signal to generate a second pre-control signal; and an input/output (I/O) control signal generation circuit configured to generate an input control signal in response to the internal clock signal and the first pre-control signal, configured to generate an output control signal in response to the operation clock signal and the second pre-control signal, and configured to control a signal input operation of a pipe latch circuit using the input control signal and control a signal output operation of the pipe latch circuit using the output control signal.

15. The semiconductor device of claim 14, wherein the pre-control signal generation circuit includes:

a first pre-control signal generation circuit configured to latch the input clock signal in synchronization with the internal clock signal to generate the first pre-control signal;

a first delay circuit configured to delay the internal clock signal by a first delay amount to generate the operation clock signal, the first delay amount being determined according to a phase information signal;

a second delay circuit configured to delay the first pre-control signal by the first delay amount to generate a delay control signal; and a second pre-control signal generation circuit configured to delay the delay control signal by a second delay amount to generate the second pre-control signal, the second delay amount being determined according to a read latency signal and a path information signal.

16. The semiconductor device of claim 15, wherein the phase information signal includes information on a phase difference between a clock signal provided by an external device and a delay locked loop (DLL) clock signal generated in the semiconductor device.

17. The semiconductor device of claim 15, wherein the second pre-control signal generation circuit includes:

an internal code generation circuit configured to subtract a value of the path information signal from a value of the read latency signal to generate an internal code, the path information signal indicating an internal delay amount, the read latency signal indicating a read latency period;

a decoder configured to decode the internal code to generate a plurality of decoded signals, at most one of the plurality of decoded signals being selectively enabled; and a shifting circuit configured to delay the delay control signal by the second delay amount to generate the second pre-control signal, the second delay amount being determined according to the plurality of decoded signals and the operation clock signal.

18. The semiconductor device of claim 15, wherein the second delay circuit generates the delay control signal transitioning between two logic values in synchronization with the operation clock signal.

19. The semiconductor device of claim 14, wherein the pipe latch circuit is configured to latch an internal command in response to the input control signal and configured to output the latched internal command as an output enablement signal in response to the output control signal.

20. The semiconductor device of claim 19, further comprising a data input/output (I/O) circuit configured to be synchronized with a strobe signal to output input data as output data in response to the output enablement signal.

* * * * *